(12) United States Patent
Morihara et al.

(10) Patent No.: US 11,752,501 B2
(45) Date of Patent: Sep. 12, 2023

(54) SILICONE MEMBER AND MICRO DEVICE (71) Applicant: Sumitomo Riko Company Limited, Aichi (JP)

(72) Inventors: Koji Morihara, Aichi (JP); Katsumi Okashita, Aichi (JP); Yasunori Nimura, Aichi (JP); Kazumi Yoshida, Aichi (JP)

(73) Assignee: Sumitomo Riko Company Limited, Aichi (JP)

( * ) Notice: Subject to any disclaimer, the term of this patent is extended or adjusted under 35 U.S.C. 154(b) by 263 days.

(21) Appl. No.: 17/020,848

(22) Filed: Sep. 15, 2020

(65) Prior Publication Data
US 2021/0094031 A1  Apr. 1, 2021

(30) Foreign Application Priority Data

Sep. 30, 2019 (JP) .................................. 2019-179831
Jul. 6, 2020 (JP) .................................. 2020-116301

(51) Int. Cl.
*B01L 3/00* (2006.01)

(52) U.S. Cl.
CPC ......... *B01L 3/508* (2013.01); *B01L 2200/141* (2013.01); *B01L 2300/12* (2013.01); *B01L 2300/16* (2013.01)

(58) Field of Classification Search
CPC ...... B01L 3/5025; B01L 3/505; B01L 3/5085; B01L 3/5088; B01L 2200/141; B01L 2300/0829; B01L 2300/089; B01L 2300/16; B01L 2300/163; B01L 3/5027; B01L 2300/0816; B01L 2300/0819
See application file for complete search history.

(56) References Cited

U.S. PATENT DOCUMENTS

| | | | |
|---|---|---|---|
| 9,056,989 B2 | 6/2015 | Suzuki | |
| 2009/0298116 A1* | 12/2009 | Fang | B01L 3/5085 430/320 |
| 2011/0039991 A1* | 2/2011 | Iijima | C08K 5/3415 524/99 |
| 2014/0051788 A1 | 2/2014 | Suzuki | |

FOREIGN PATENT DOCUMENTS

| | | |
|---|---|---|
| JP | 2006181407 | 7/2006 |
| JP | 2013199509 | 10/2013 |
| JP | 2017154036 | 9/2017 |

* cited by examiner

*Primary Examiner* — Jill A Warden
*Assistant Examiner* — Dwayne K Handy
(74) *Attorney, Agent, or Firm* — JCIPRNET (57) ABSTRACT

A silicone member used for a micro device and a micro device which achieve both electrification suppression and light transmittance are provided. The silicone member is used as a micro device and has a holding part for holding samples, or defines the holding part through the combination with a counterpart member. The silicone member includes a silicone material which has silicone and an ionic conductive agent, and the content of the ionic conductive agent is 0.01 part by mass or higher and 1 part by mass or lower with respect to 100 parts by mass of the silicone. The micro device includes the silicone member.

6 Claims, 3 Drawing Sheets

SILICONE MEMBER AND MICRO DEVICE

CROSS-REFERENCE TO RELATED APPLICATION

This application claims the priority benefits of Japanese application no. 2019-179831, filed on Sep. 30, 2019 and Japanese application no. 2020-116301, filed on Jul. 6, 2020. The entirety of the above-mentioned patent application is hereby incorporated by reference herein and made a part of this specification.

BACKGROUND

Technical Field

The disclosure relates to a silicone member which is used as a micro device.

Related Art

A micro device holds samples in a tiny depression (well) or in a groove and performs various operations like check, reaction, extraction, separation, measurement, and so on. As a material of the member constituting the micro device, silicone has been frequently used because fine processing for unevenness is easy and light transmittance, chemical resistance and so on of silicone is excellent (for example, see Patent Literature 1 (Japanese Patent Laid-open No. 2006-181407) and Patent Literature 2 (Japanese Patent Laid-open No. 2017-154036)).

Because silicone is easy to be electrified, dust in the air, tiny burr during molding and so on are easily adsorbed. In the micro device, the holding part of the samples is formed through a fine structure of unevenness. For this reason, if dust or tiny burr adheres to the holding part of the samples, observation cannot be performed properly and the samples do not flow.

As an approach for suppressing electrification of silicone, there is a method of mixing an antistatic ingredient into a mold release agent applied to a mold when a silicone member is molded. In this case, by attaching the antistatic ingredient to the surface of the silicone member, a corresponding effect can be expected, but if the antistatic ingredient and so on adhere to the holding part, there is a risk of hindering check, reaction and so on. In addition, if an ionizer is used to eliminate static electricity from the surface of the silicone member, an antistatic effect will be obtained temporarily, but it is difficult to sustain the effect. For this reason, even if the static electricity is eliminated from the silicone member, the effect of eliminating static electricity will be lost while the silicone member is hermetically baled and transported.

As described in Patent Literature 3 (Japanese Patent Laid-open No. 2013-199509), it is known that if a conducting material is added in the silicone, electrification can be suppressed. However, if a conducting material is added, there is a risk of reducing the transparency of the silicone member. For example, when the micro device is used to perform an optical check, the micro device is set on a sample stage of a microscope and irradiated with light from the underside, and the extremely weak emission of visible light in the holding part is observed. In this case, high light transmittance is required for the micro device (the silicone member), and thus it is undesirable to add the ingredients degrading transparency. Meanwhile, Patent Literature 3 describes a silicone rubber composition used in a keypad, a gasket, a rubber vibration isolator and so on, and the light transmittance (transparency) of the molded product of the composition has not been discussed.

The disclosure provides a silicone member used for a micro device and a micro device which achieve both electrification suppression and light transmittance.

SUMMARY (1) The silicone member of the disclosure is used as a micro device and has a holding part for holding samples, or defines the holding part through the combination with a counterpart member. The silicone member includes a silicone material which has silicone and an ionic conductive agent, and the content of the ionic conductive agent is 0.01 part by mass or higher and 1 part by mass or lower with respect to 100 parts by mass of the silicone.

(2) The micro device of the disclosure includes the silicone member of the disclosure in (1).

DESCRIPTION OF THE EMBODIMENTS

In the following, a silicone member and a micro device of embodiments of the disclosure are described.

First Embodiment

Figure 1:
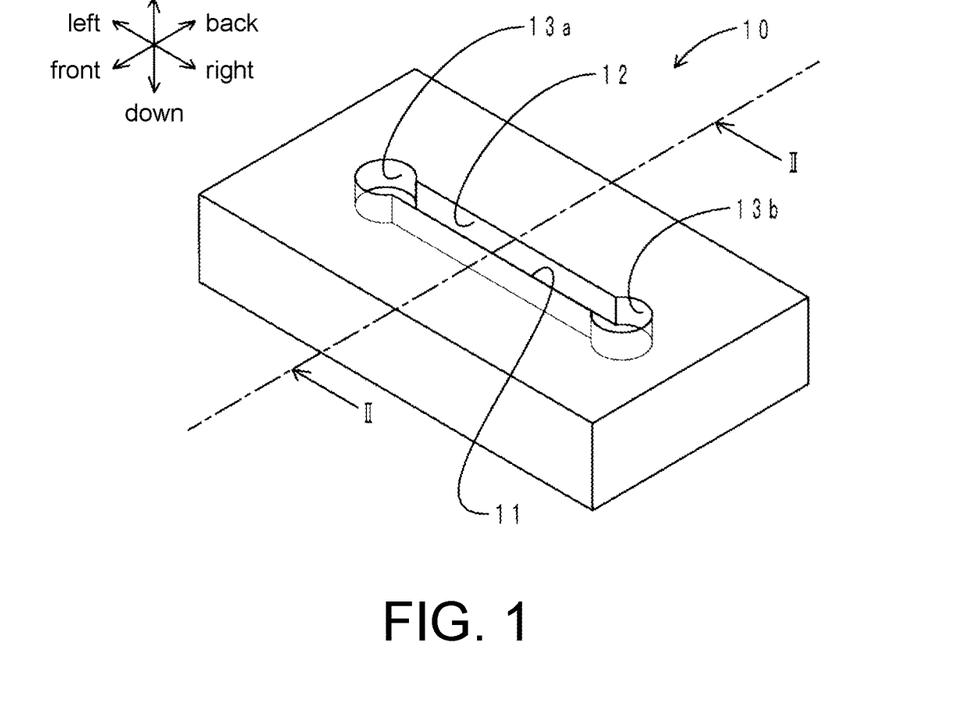
FIG. 1 is a perspective view of a silicone member of a first embodiment.
Figure 2:
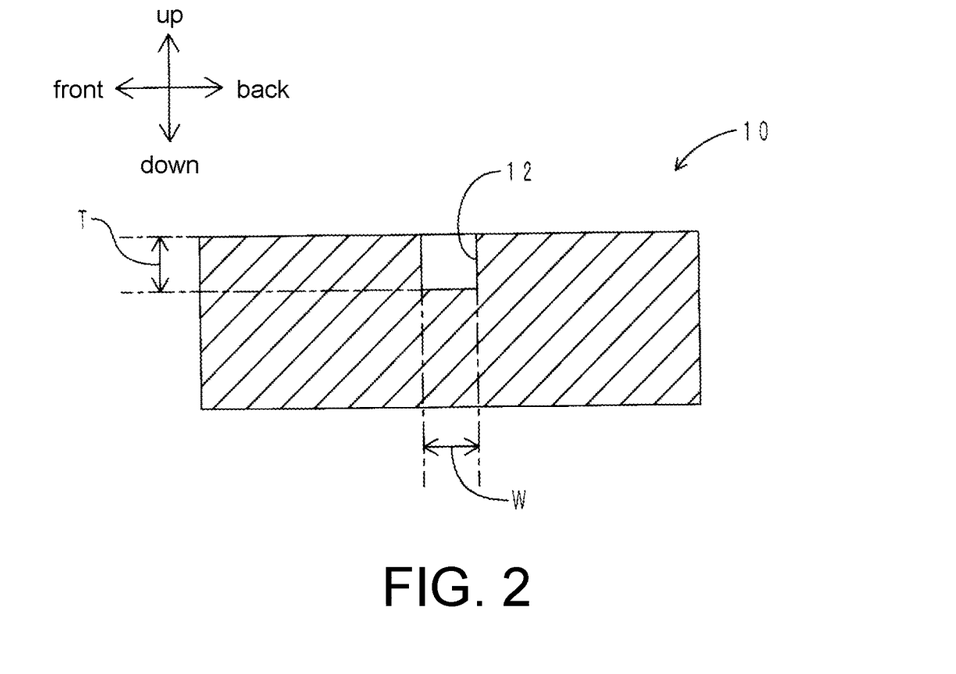
FIG. 2 is a sectional view taken along II-II of FIG. 1.

Firstly, the structure of the silicone member of a first embodiment is described. In FIG. 1, a perspective view of the silicone member of the first embodiment is illustrated. In FIG. 2, a sectional view taken along II-II of FIG. 1 is illustrated. In FIG. 1, the perspective part is illustrated by thin lines. As illustrated in FIG. 1, the silicone member 10 has rectangular thin-sheet like shape. On the upper surface of the silicone member 10, a holding part 11 is formed in a recessed form. The holding part 11 has a groove part 12 and two hole parts 13a and 13b. The groove part 12 has a straight line shape extending in the left-right direction, and the left and right ends of the groove part 12 are connected to the two hole parts 13a and 13b. The two hole parts 13a and 13b are open in circle, respectively. As illustrated in FIG. 2, a depth T of the groove part 12 (holding part 11) is 100 μm, and a width (the length in the front-back direction) W of the groove part 12 is 100 μm. For example, a sample liquid is injected from the hole part 13a, flows in the groove part 12, and is taken out of the hole part 13b. In this way, the silicone member 10 has the holding part 11 and is used independently as a micro device.

The silicone member 10 is made of a silicone material which has silicone rubber and an ionic liquid. The content of the ionic liquid is 0.1 part by mass with respect to 100 parts by mass of the silicone rubber. The visible-light transmittance of the silicone member 10 is 85%, and the volume resistivity is $1.2 \times 10^{12}$ Ω·cm.

Next, the operational effects of the silicone member 10 (micro device) of the embodiment are described. The silicone member 10 includes a given amount of an ionic liquid. For this reason, the volume resistivity decreases, and electrification is suppressed. As a result, the tiny burr during molding, the dust in the air and so on are not prone to adhere to the silicone member 10. In addition, because the visible-light transmittance is 85%, the silicone rubber does not lose the original transparency. Therefore, according to the silicone member 10, the samples can be held in the holding part 11, and various operations like check, reaction and so on can be correctly carried out.

Second Embodiment

Figure 3:
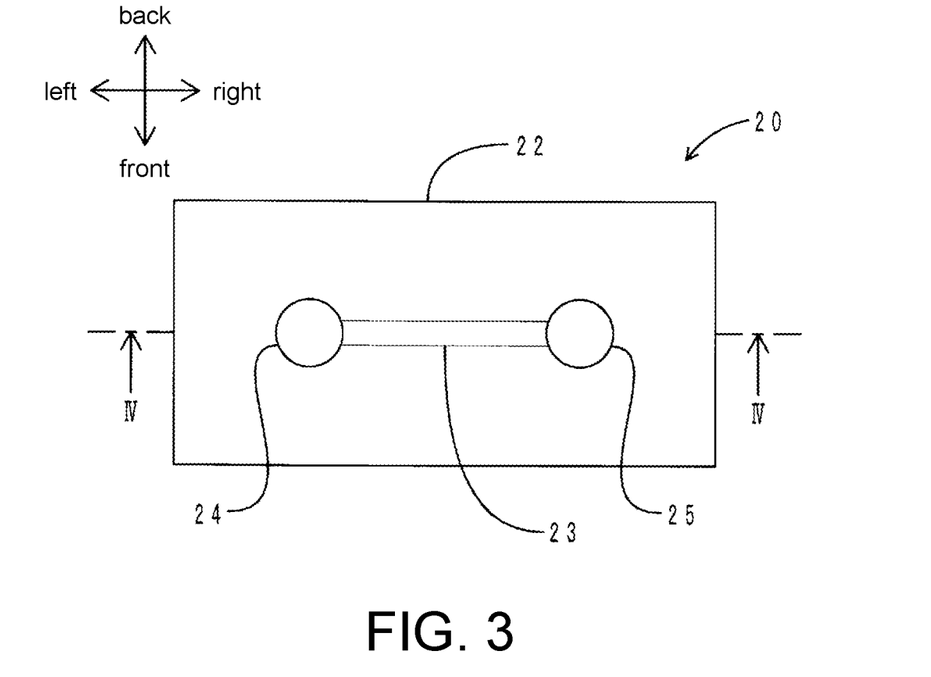
FIG. 3 illustrates a plan view of a micro device of a second embodiment.
Figure 4:
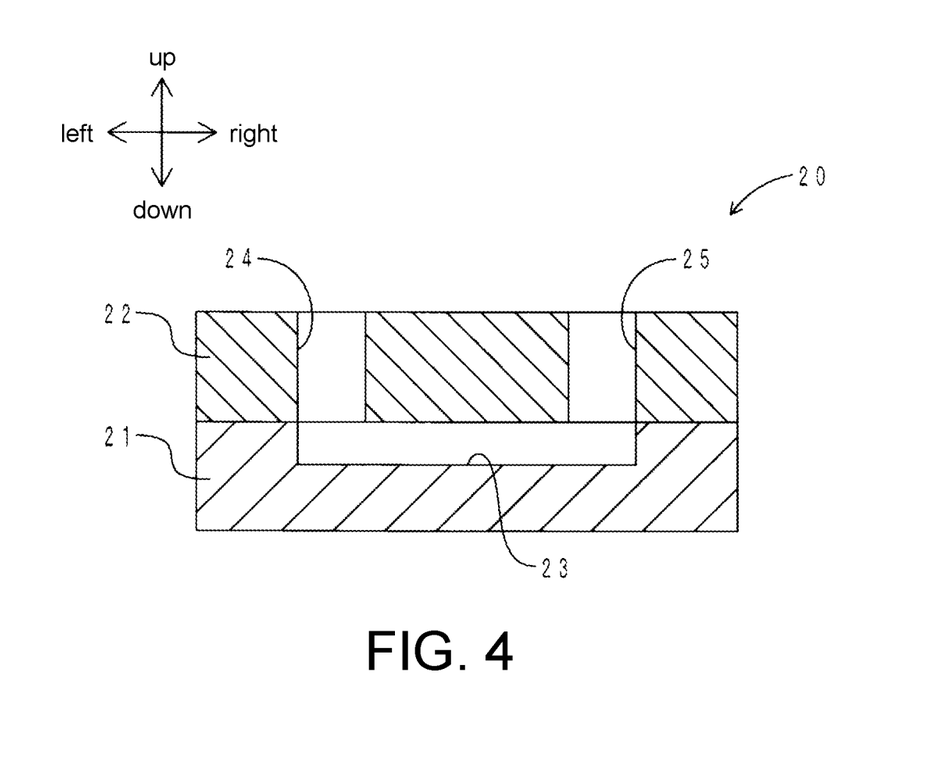
FIG. 4 is a sectional view taken along IV-IV of FIG. 3.

The main difference between a micro device of the present embodiment and the micro device (the silicone member) of the first embodiment is that the micro device includes two silicone members in the present embodiment. Firstly, the structure of the micro device of the present embodiment is described. In FIG. 3, a plan view of the micro device of the second embodiment is illustrated. In FIG. 4, a sectional view taken along IV-IV of FIG. 3 is illustrated. In FIG. 3, the perspective part is illustrated by thin lines. As illustrated in FIG. 3 and FIG. 4, the micro device 20 has a rectangular thin-sheet like shape as a whole. The micro device 20 has a first silicone member 21 and a second silicone member 22.

The first silicone member 21 has a rectangular thin-sheet like shape. On the upper surface of the first silicone member 21, a groove part 23 is formed in a recessed form. The groove part 23 has a straight line shape extending in the left-right direction. The depth (the length in the up-down direction) of the groove part 23 is 100 μm, and the width (the length in the front-back direction) is 100 μm. The first silicone member 21 is made of the silicone material the same as that in the first embodiment.

The second silicone member 22 has a rectangular thin-sheet like shape having the same size as the first silicone member 21. The second silicone member 22 is made of the silicone material the same as that in the first embodiment. The second silicone member 22 is laminated on the upper surface of the first silicone member 21. The second silicone member 22 has two hole parts 24 and 25. The two hole parts 24 and 25 are respectively cylindrical and penetrate the second silicone member 22 in the up-down direction. The left end of the groove part 23 of the first silicone member 21 is connected to the bottom opening of the hole part 24, and the right end is connected to the bottom opening of the hole part 25. The groove part 23 is sealed off by the second silicone member 22 except the left and right ends. For example, a sample liquid is injected from the hole part 24, flows in the groove part 23, and is taken out of the hole part 25. The groove part 23 and the two hole parts 24 and 25 are included in the concept of the holding part in the disclosure. In other words, in the micro device 20, the holding part is defined through the combination of the first silicone member 21 and the second silicone member 22.

Next, the operational effects of the micro device 20 of the present embodiment are described. The first silicone member 21 and the second silicone member 22 include a given amount of an ionic liquid. For this reason, the volume resistivity decreases, and electrification is suppressed. As a result, the tiny burr during molding, the dust in the air and so on are not prone to adhere to the two members. In addition, the silicone rubber will not lose the original transparency in either of the members. Therefore, according to the micro device 20, the samples can be held in the holding part (the groove part 23 and the two hole part 24 and 25), and various operations like check, reaction and so on can be correctly carried out.

Third Embodiment

Figure 5:
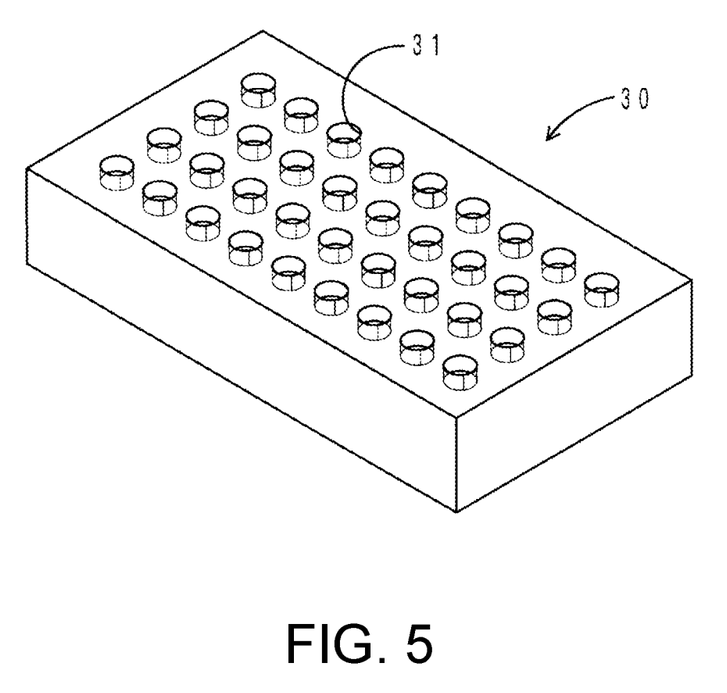
FIG. 5 illustrates a perspective view of a silicone member of a third embodiment.

Firstly, the structure of a silicone member of a third embodiment is described. In FIG. 5, a perspective view of the silicone member of the third embodiment is illustrated. In FIG. 5, the perspective part is illustrated by thin lines. As illustrated in FIG. 5, the silicone member 30 has a rectangular thin-sheet like shape. On the upper surface of the silicone member 30, a plurality of wells (depressions) 31 are formed in a recessed form. The opening part of the well 31 is circular, and the bottom part is planar. The diameter of the opening part of the well 31 is 100 μm, and the depth is also 100 μm. Any one of the plurality of wells 31 has the same shape and size. The samples are held in the wells 31. In other words, the wells 31 are included in the concept of the holding part of the disclosure. The silicone member 30 has the holding part and is used independently as a micro device. The silicone member 30 is made of the silicone material the same as that in the first embodiment.

Next, the operational effects of the silicone member 30 of the present embodiment are described. Similarly to the silicone member 10 of the first embodiment, electrification is also suppressed in the silicone member 30, and thus the tiny burr during molding, the dust in the air and so on are not prone to adhere to the silicone member 30. In addition, the silicone rubber does not lose the original transparency. Therefore, according to the silicone member 30, samples are held in the wells 31, and various operations like check, reaction and so on can be correctly carried out.

Other Embodiments

The silicone member and the micro device of the disclosure are not limited to the above embodiments, and changes and improvements that may be made by the person skilled in the art can be implemented in various embodiments in a scope not departing from the spirit of the disclosure.

[The Silicone Member]

The silicone member of the disclosure is used as a micro device, and may have a holding part which holds samples in itself or define the holding part through the combination with a counterpart member. The "holding part" in the disclosure includes not only the space for the arrangement of the samples, but also the space like a flow channel and so on which the samples only pass through. Besides solid like grain and so on, liquid, and gas, the samples may be a mixture in which these forms are mixed appropriately. The shape, the size, and the arrangement form of the holding part are not particularly limited. The shape of the holding part may be, for example, a hole, a groove, a depression and so on. The section of the holding part in the direction of depth includes, not particularly limited to, a rectangular shape like a square, an oblong, a trapezoid and so on, or a curved surface like a semicircle, an ellipse and so on, or a V-shape. The depth of holding part may be determined appropriately according to the thickness of the silicone member and the micro device. For example, when the silicone member is a micro device for optical check using a microscope, the depth of the holding part is desirably 300 μm or lower. In addition, when the holding part has a groove-like flow channel, the width of the flow channel is also desirably 300 μm or lower. The silicone member of the disclosure may have a barrier layer with hydrophilicity or hydrophobicity on the surface of the holding part and so on. The barrier layer may be formed by surface modification or film forming.

The silicone member of the disclosure is made of a silicone material which has silicone and an ionic conductive agent. The silicone material may include an additive like an adhesive ingredient and so on as needed. In the description, the so-called "silicone" is the concept including both silicone resin and silicone rubber. In the "silicone", in addition to a polymer ingredient, a crosslinking agent for crosslinking the polymer, a catalyst and so on are included. The silicone rubber widely known as organopolysiloxane may be used as the silicone rubber. The silicone rubber may be liquid rubber or solid (millable) rubber. In terms of capable of forming fine structures like unevenness and so on with high dimensional precision, the silicone rubber may be liquid rubber.

The organopolysiloxane has a prescribed reactive group in accordance with the crosslinking mechanism (hardening mechanism). The reactive group may be, for example, an alkenyl group (a vinyl group, an allyl group, a butenyl group, a pentenyl group, a hexenyl group, and so on), a silanol group and so on. The organopolysiloxane which has an alkenyl group is crosslinked through a peroxide crosslinking reaction using an organic peroxide as the crosslinking agent or an addition reaction using the organopolysiloxane (organohydrogen polysiloxane) which has a hydrosilyl group as the crosslinking agent. In the addition reaction, a hydrosilylation catalyst like a platinum catalyst may be used in combination. The organopolysiloxane which has a silanol group is crosslinked through a condensation reaction. In the condensation reaction, a crosslinking agent for condensation may be used in combination.

The content of the ionic conductive agent in the silicone material is 0.01 part by mass or higher and 1 part by mass or lower with respect to 100 parts by mass of the silicone. When the content is below 0.01 part by mass, because the effect of giving electrical conductivity is small, the desired effect of electrification suppression cannot be obtained. The content may be, in some embodiments, 0.02 part by mass or higher, and in some embodiments 0.05 part by mass or higher. Conversely, if the content becomes higher than 1 part by mass, the light transmittance will be reduced and the transparency will be lost. The content may be, in some embodiments, 0.8 part by mass or lower, and in some embodiments 0.5 part by mass or lower.

Considering the compatibility with the silicone, the light transmittance of the silicone member and so on, the ionic conductive agent may be an ionic liquid. The ionic liquid is a salt including the cation of pyridinium, imidazolium, quaternary ammonium, quaternary phosphonium and so on, and the anion of halogen, triflate, tetrafluoroborate, hexafluorophosphate and so on. The "ionic liquid" in the disclosure has a melting point of 80° C. or lower no matter the ionic liquid is liquid or solid at room temperature. If an ionic liquid that has a melting point of higher than 80° C. is used, there is a risk that the ionic liquid will separate out during manufacturing of the silicone member, and the light transmittance of the silicone member will degrade. In particular, the ionic liquid in which the cation has a functional group capable of reacting with the silicone (hereinafter appropriately referred to as "reactive ionic liquid") not only has favorable compatibility with the silicone, but also is immobilized through the chemical bond with the silicone. For this reason, the bleed phenomenon that the ingredients of the ionic liquid emerge to the surface of the silicone member after manufacturing can be suppressed.

The reactive ionic liquid may be an ionic liquid having one or more kinds of functional groups chosen from a functional group which has a double bond and a functional group which has an —OX group (X is a hydrogen atom or an alkyl group) in the cation. The functional group which has a double bond may be, for example, an allyl group, an acrylic group, a methacrylic group and so on, and the functional group which has an —OX group may be, for example, a hydroxyl group (—OH), an alkoxysilyl group (—Si(OR)$_3$: R is an alkyl group) and so on.

From the viewpoint of ensuring the desired light transmittance, the visible-light transmittance of the silicone member of the disclosure may be, in some embodiments, 80% or higher, and in some embodiments 85% or higher. In the specification, the visible-light transmittance is a value calculated by measuring, according to JIS A5759: 2016, the transmission spectrum having a wavelength of 380 to 780 nm through the spectrophotometer "UV3100PC" made by Shimadzu Co., Ltd.

From the viewpoint of suppressing electrification, the volume resistivity of the silicone member of the disclosure may be, in some embodiments, $1.2 \times 10^{13}$ Ω·cm or lower, and in some embodiments $1.5 \times 10^{12}$ Ω·cm or lower.

[Micro Device]

The micro device of the disclosure may be the silicone member of the disclosure as in the first and the third embodiment, or may be constituted by combining the silicone members of the disclosure with each other as in the second embodiment. In other words, the number of the member constituting the micro device of the disclosure is not particularly limited and may be one or two or more. In addition to the silicone member of the disclosure, the constituent member may be, for example, a counterpart member defining the holding part through the combination with the silicone member of the disclosure, a substrate supporting the silicone member of the disclosure, and so on.

When the micro device of the disclosure is constituted of a plurality of members, the material, the shape, the size and so on of the members except the silicone member of the disclosure are not particularly limited. For example, the material of the counterpart member defining the holding part through the combination with the silicone member of the disclosure may be, for example, fluororesin, glass and so on, in addition to silicone like polydimethyl siloxane (PDMS) and so on. As the material of the substrate supporting the silicone member of the disclosure, from the viewpoint of being comparatively hard, excellent in light transmittance, and having low autofluorescence, the material of the substrate may be olefin resin or acrylic resin. When the counterpart member includes silicone, the ionic conductive agent may not be included, and when the ionic conductive agent is included, the content of the ionic conductive agent may be different from the silicone member of the disclosure.

The constituent member of the micro device of the disclosure may be merely laminated, or may be adhered using an adhesive agent or by crosslinking adhesion. The thickness of the micro device of the disclosure may be determined appropriately according to the use. For example, when the micro device is used for optical check using a microscope, the thickness is desirably 1 mm or lower, more desirably 750 μm or lower, and further desirably 500 μm or lower.

EXAMPLES

Next, examples are given to describe the disclosure more specifically. The type and the content of the ionic conductive agent are changed to manufacture test pieces of the silicone member, and the light transmittance and the electrostatic property are evaluated.

<Manufacturing of Test Piece>

Example 1

Firstly, 0.1 part by mass of the reactive ionic liquid (A) which has a hydroxyl group in the cation is added to 100 parts by mass of liquid silicone rubber ("KE-2061-50A/B" made by Shin-Etsu Chemical Industry Co., Ltd.), and mixed for 30 minutes through a planetary mixer. After that, vacuum degassing is performed on the mixture to prepare a composition (silicone material). The liquid silicone rubber that is used includes an organopolysiloxane which has a vinyl group, a crosslinking agent, and a catalyst. Next, the composition that is prepared is molded by pressing at 120° C. for 10 minutes and then dried at 150° C. for one hour, and a square sheet-like test piece of 12 cm in length, 12 cm in width and 2 mm in thickness is made. The test piece that is made is called the test piece of Example 1. The reactive ionic liquid (A) that is used is N-oleyl-N,N-di(2-hydroxyethyl)-N-methylammonium=bis(trifluoromethanesulfonyl)imide (made by FUJIFILM Wako Pure Chemical Co., Ltd.).

Example 2

A test piece is made in the same manner as in Example 1 except that the reactive ionic liquid (A) used in Example 1 is changed to a reactive ionic liquid (B) which has a methacrylic group in the cation. The test piece that is made is called the test piece of Example 2. The reactive ionic liquid (B) that is used is (2-methacryloyloxyethyl)trimethylammonium=bis(trifluoromethanesulfonyl)imide (made by FUJIFILM Wako Pure Chemical Co., Ltd.).

Example 3

A test piece is made in the same manner as in Example 1 except that the reactive ionic liquid (A) used in Example 1 is changed to a reactive ionic liquid (C) which has an acrylic group in the cation. The test piece that is made is called the test piece of Example 3. The reactive ionic liquid (C) that is used is (2-acryloyloxyethyl)trimethylammonium=bis(trifluoromethanesulfonyl)imide (made by FUJIFILM Wako Pure Chemical Co., Ltd.).

Example 4

A test piece is made in the same manner as in Example 1 except that the reactive ionic liquid (A) used in Example 1 is changed to a reactive ionic liquid (D) which has a hydroxyl group and a methacrylic group in the cation. The test piece that is made is called the test piece of Example 4. The reactive ionic liquid (D) that is used is 2-hydroxy-3-methacryloyloxy propyltrimethylammonium=bis(trifluoromethanesulfonyl)imide (made by FUJIFILM Wako Pure Chemical Co., Ltd.).

Example 5

A test piece is made in the same manner as in Example 4 except that the blending quantity of the reactive ionic liquid (D) used in Example 4 is changed to 0.15 part by mass. The test piece that is made is called the test piece of Example 5.

Example 6

A test piece is made in the same manner as in Example 4 except that the blending quantity of the reactive ionic liquid (D) used in Example 4 is changed to 0.01 part by mass. The test piece that is made is called the test piece of Example 6.

Example 7

A test piece is made in the same manner as in Example 4 except that the blending quantity of the reactive ionic liquid (D) used in Example 4 is changed to 1 part by mass. The test piece that is made is called the test piece of Example 7.

Example 8

A test piece is made in the same manner as in Example 1 except that the reactive ionic liquid (A) used in Example 1 is changed to a reactive ionic liquid (E) which has an alkoxysilyl group in the cation. The test piece that is made is called the test piece of Example 8. The reactive ionic liquid (E) that is used is 3-methyl-1-trimethoxysilyl propylpyridium=bis(trifluoromethanesulfonyl)imide. The manufacturing method of the reactive ionic liquid (E) is described below.

Firstly, in a nitrogen atmosphere, 60 mmol of 3-methylpyridine (made by Tokyo Chemical Industry Co., Ltd.) and 55 mmol of 3-chloropropyl trimethoxysilane (made by Tokyo Chemical Industry Co., Ltd.) are mixed and made to react for 72 hours at 90° C. After that, the reaction fluid is cooled, the solid that is deposited is cleaned twice with ethyl acetate, and then the ethyl acetate is eliminated under reduced pressure to thereby obtain 53 mmol of 3-methyl-1-trimethoxysilyl propylpyridinium chloride. The product is dissolved into acetone, 53 mmol of lithium bis(trifluoromethanesulfonyl)imide (made by Tokyo Chemical Industry Co., Ltd.) is added, and the mixture is agitated for 24 hours at room temperature. Then, the acetone is eliminated under reduced pressure, and the lithium chloride that is deposited is filtrated to thereby obtain 3-methyl-1-trimethoxysilyl propylpyridinium=bis(trifluoromethanesulfonyl)imide (the reactive ionic liquid (E)).

Example 9

A test piece is made in the same manner as in Example 1 except that the reactive ionic liquid (A) used in Example 1 is changed to a reactive ionic liquid (F) which has an alkoxysilyl group in the cation. The test piece that is made is called the test piece of Example 9. The reactive ionic liquid (F) that is used is N-{(3-triethoxysilylpropyl)carbamoyloxyethyl)}-N,N,N-trimethylammonium bis(trifluoromethanesulfonyl)imide. The manufacturing method of the reactive ionic liquid (F) is described below.

Firstly, in a nitrogen atmosphere, 60 mmol of (2-hydroxyethyl)trimethylammonium chloride (made by Tokyo Chemical Industry Co., Ltd.) and 59 mmol of 3-isocyanatopropyl triethoxysilane (made by Tokyo Chemical Industry Co., Ltd.) are mixed and made to react for 48 hours at 75° C. After that, the reaction fluid is cooled, the solid that is deposited is cleaned twice with ethyl acetate, and then the ethyl acetate is eliminated under reduced pressure to thereby obtain 55 mmol of a compound in which the anion of the ionic liquid is chloride. The compound is dissolved into acetone, 55 mmol of lithium bis(trifluoromethanesulfonyl) imide (made by Tokyo Chemical Industry Co., Ltd.) is added, and the mixture is agitated for 24 hours at room temperature. Then, the acetone is eliminated under reduced pressure, and the lithium chloride that is deposited is filtrated to thereby obtain N-{(3-triethoxysilylpropyl)carbamoyloxyethyl)}-N,N,N-trimethylammonium bis(trifluoromethanesulfonyl)imide (reactive ionic liquid (F)).

Example 10

A test piece is made in the same manner as in Example 1 except that the reactive ionic liquid (A) used in Example 1 is changed to a reactive ionic liquid (G) which has an allyl group in the cation. The test piece that is made is called the test piece of Example 10. The reactive ionic liquid (G) that is used is diallylhexylmethylammonium=bis(trifluoromethanesulfonyl)imide. The manufacturing method of the reactive ionic liquid (G) is described below.

Firstly, 150 mmol of diallylmethylamine, 180 mmol of n-hexylbromide and 50 g of acetonitrile are mixed and made to react for 24 hours at 105° C. After that, the reaction fluid is cooled to room temperature, and hexane is added to extract and eliminate the unreacted part. Then, the remaining liquid is condensed using an evaporator under reduced pressure, and diallylhexylmethylammonium·bromide is obtained. Next, the diallylhexylmethylammonium.bromide that is obtained and lithium bis(trifluoromethanesulfonyl) imidet are added to an aqueous solvent and agitated for 4 hours at room temperature to thereby obtain diallylhexylmethylammonium=bis(trifluoromethanesulfonyl)imide (reactive ionic liquid (G)).

Comparative Example 1

A test piece is made in the same manner as in Example 1 without adding an ionic liquid. The test piece that is made is called the test piece of Comparative example 1.

Comparative Example 2

A test piece is made in the same manner as in Example 4 except that the blending quantity of the reactive ionic liquid (D) used in Example 4 is changed to 0.005 part by mass. The test piece that is made is called the test piece of Comparative example 2.

Comparative Example 3

A test piece is made in the same manner as in Example 4 except that the blending quantity of the reactive ionic liquid (D) used in Example 4 is changed to 3 parts by mass. The test piece that is made is called the test piece of Comparative example 3.

<Evaluation Method>
[Light Transmittance]

The transmission spectrum is measured according to JIS A5759: 2016 by a spectrophotometer "UV3100PC" made by Shimadzu Co., Ltd. and the visible-light transmittance of the test piece is calculated.

[Electrostatic Property]
(1) Powder Adherability

Styrene foam powder is prepared, and the test piece is moved closer to the styrene foam powder without contact to a place 10 mm from the styrene foam powder. At this time, when the styrene foam powder is not attracted to the test piece, it is evaluated that no adherence of the powder due to electrification exists (shown as a mark of ○ in Table 1 mentioned later), and when the styrene foam powder is attracted to the test piece, it is evaluated that the adherence of the powder due to electrification exists (shown as a mark of × in Table 1).

(2) Volume Resistivity

The volume resistivity of the test piece is measured according to "5.13 Resistivity" and "5.13.1 Molding material" of JIS K 6911-1995. Firstly, silver paste is applied to the upper surface of the test piece, and a square electrode of 1 cm in length and 1 cm in width is formed (with guard electrode), and a square electrode of 1 cm in length and 1 cm in width is formed on the under surface in the same way. Then, a voltage of 100 V is applied between the electrodes up and down to measure the volume resistance between the electrodes, and the volume resistivity is calculated.

<Evaluation Results>

The blending quantity of the materials that are used and the evaluation results are collectively shown in Table 1 and Table 2. Examples 1 to 10 are shown in Table 1, and Comparative examples 1 to 3 are shown in Table 2.

TABLE 1

| Silicone member (unit of material is part by mass) | | Example 1 | Example 2 | Example 3 | Example 4 | Example 5 |
| --- | --- | --- | --- | --- | --- | --- |
| Silicone | Liquid silicone rubber | 100 | 100 | 100 | 100 | 100 |
| Ionic liquid (ionic conductive agent) | (A) Hydroxyl group | 0.1 | — | — | — | — |
| | (B) Methacrylic group | — | 0.1 | — | — | — |
| | (C) Acrylic group | — | — | 0.1 | — | — |
| | (D) Hydroxyl group/ methacrylic group | — | — | — | 0.1 | 0.15 |
| | (E) Alkoxysilyl group | — | — | — | — | — |
| | (F) Alkoxysilyl group | — | — | — | — | — |
| | (G) Allyl group | — | — | — | — | — |
| Evaluation Result | Visible-light transmittance [%] | 85 | 81 | 83 | 83 | 82 |
| | Powder adherability due to electrification | ○ | ○ | ○ | ○ | ○ |
| | Volume resistivity [Ω·cm] | $1.2 \times 10^{12}$ | $1.5 \times 10^{12}$ | $1.5 \times 10^{12}$ | $1.2 \times 10^{12}$ | $1.1 \times 10^{11}$ |

| Silicone member (unit of material is part by mass) | | Example 6 | Example 7 | Example 8 | Example 9 | Example 10 |
| --- | --- | --- | --- | --- | --- | --- |
| Silicone | Liquid silicone rubber | 100 | 100 | 100 | 100 | 100 |
| Ionic liquid (ionic conductive agent) | (A) Hydroxyl group | — | — | — | — | — |
| | (B) Methacrylic group | — | — | — | — | — |
| | (C) Acrylic group | — | — | — | — | — |
| | (D) Hydroxyl group/ methacrylic group | 0.01 | 1 | — | — | — |

TABLE 1-continued

|  |  |  |  |  |  |  |
|---|---|---|---|---|---|---|
|  | (E) Alkoxysilyl group | — | — | 0.1 | — | — |
|  | (F) Alkoxysilyl group | — | — | — | 0.1 | — |
|  | (G) Allyl group | — | — | — | — | 0.1 |
| Evaluation Result | Visible-light transmittance [%] | 89 | 80 | 81 | 84 | 84 |
|  | Powder adherability due to electrification | ○ | ○ | ○ | ○ | ○ |
|  | Volume resistivity [Ω · cm] | $1.2 \times 10^{13}$ | $1.0 \times 10^{10}$ | $2.0 \times 10^{11}$ | $8.3 \times 10^{11}$ | $2.6 \times 10^{11}$ |

TABLE 2

| Silicone member (unit of material is part by mass) |  | Comparative example 1 | Comparative example 2 | Comparative example 3 |
|---|---|---|---|---|
| Silicone | Liquid silicone rubber | 100 | 100 | 100 |
| Ionic liquid (ionic conductive agent) | (A) Hydroxyl group | — | — | — |
|  | (B) Methacrylic group | — | — | — |
|  | (C) Acrylic group | — | — | — |
|  | (D) Hydroxyl group/methacrylic group | — | 0.005 | 3 |
|  | (E) Alkoxysilyl group | — | — | — |
|  | (F) Alkoxysilyl group | — | — | — |
|  | (G) Allyl group | — | — | — |
| Evaluation Result | Visible-light transmittance [%] | 90 | 90 | 65 |
|  | Powder adherability due to electrification | x | x | ○ |
|  | Volume resistivity [Ω · cm] | $2.8 \times 10^{14}$ | $1.0 \times 10^{14}$ | $1.0 \times 10^{10}$ |

As shown in Table 1 and Table 2, in the test piece of Comparative example 1 which does not include an ionic liquid, although the visible-light transmittance is high, electrification is confirmed because the volume resistivity is high and the styrene foam powder is adhered. In contrast, in any one of the test pieces of Examples 1 to 10, the visible-light transmittance is as high as 80% or more, and no adherence of the styrene foam powder is observed. In other words, the test pieces of Examples 1 to 10 have excellent light transmittance, and electrification is suppressed.

Comparing the test pieces of Examples 4 to 7 and Comparative examples 2 and 3 in which only the quantity of the ionic liquid is different, the more the quantity of the ionic liquid, the higher the electrical conductivity, but a trend that the light transmittance is reduced is shown. In the test piece of Comparative example 3 in which the quantity of the ionic liquid is 3 parts by mass, the visible-light transmittance is even reduced to 65%. In addition, the less the quantity of the ionic liquid, the higher the light transmittance, but a trend that the electrical conductivity is reduced (the volume resistivity becomes higher) is shown. In the test piece of Comparative example 2 in which the quantity of the ionic liquid is 0.005 part by mass, the effect of electrification suppression is not shown.

(1) The silicone member of the disclosure includes a silicone material which has silicone and an ionic conductive agent. The content of the ionic conductive agent in the silicone member is 0.01 part by mass or higher and 1 part by mass or lower with respect to 100 parts by mass of the silicone. Because a given amount of ionic conductive agent is included, electrical conductivity is given and electrification is not prone to occur, at the same time, the light transmittance can be ensured as well. Because electrification is not prone to occur, the adsorption of the dust in the air or the tiny burr during molding is suppressed. Therefore, according to the silicone member of the disclosure, various operations like check, reaction and so on can be correctly carried out.

(2) The micro device of the disclosure includes the silicone member of the disclosure in (1). The silicone member of the disclosure may have a holding part which holds samples, or may define the holding part through the combination with a counterpart member. As mentioned above, the silicone member of the disclosure is not prone to be electrified and has high light transmittance. Therefore, according to the micro device of the disclosure, various operations like check, reaction and so on can be correctly carried out.

What is claimed is:

1. A silicone member, which is used as a micro device and has a holding part for holding samples, wherein the holding part has a first member and a second member laminated on an upper surface of the first member, the first member has a groove part on the upper surface, and the second member has hole parts that penetrate the second member, and whereby the groove part of the first member is connected to a bottom opening of the hole parts of the second member, and wherein the silicone member includes a silicone material which has silicone and an ionic conductive agent, the ionic conductive agent is an ionic liquid selected from the group consisting of:

ionic liquid (A): N-oleyl-N,N-di(2-hydroxyethyl)-N-methylammonium=bis(trifluoromethanesulfonyl) imide, ionic liquid (B): (2-methacryloyloxyethyl) trimethylammonium=bis(trifluoromethanesulfonyl) imide, ionic liquid (D): 2-hydroxy-3-methacryloyloxy propyltrimethylammonium=bis(trifluoromethanesulfonyl)imide, and ionic liquid (G): diallylhexylmethylammonium=bis(trifluoromethanesulfonyl)imide; and a content of the ionic conductive agent is 0.01 part by mass or higher and 1 part by mass or lower with respect to 100 parts by mass of the silicone.

2. The silicone member according to claim 1, wherein the silicone member has a visible-light transmittance, and the visible-light transmittance is 80% or higher.

3. The silicone member according to claim 1, wherein the silicone is organopolysiloxane which has a crosslinkable reactive group.

4. The silicone member according to claim 1, wherein the silicone member has a volume resistivity, and the volume resistivity is $1.2 \times 10^{13}$ Ω·cm or lower.

5. The silicone member according to claim 1, wherein the holding part has a depth, and the depth is 300 μm or lower.

6. The silicone member according to claim 1, wherein a width of the groove part is 300 μm or lower.

* * * * *